(12) United States Patent
Jeon et al.

(10) Patent No.: US 6,486,512 B2
(45) Date of Patent: Nov. 26, 2002

(54) POWER SEMICONDUCTOR DEVICE HAVING HIGH BREAKDOWN VOLTAGE AND METHOD FOR FABRICATING THE SAME

(75) Inventors: Chang-ki Jeon, Kimpo (KR); Jong-jib Kim, Seoul (KR); Young-suk Choi, Puchon (KR); Chang-seong Choi, Seoul (KR); Min-whan Kim, Puchon (KR)

(73) Assignee: Fairchild Korea Semiconductor Ltd., Puchon (KR)

( * ) Notice: Subject to any disclaimer, the term of this patent is extended or adjusted under 35 U.S.C. 154(b) by 14 days.

(21) Appl. No.: 09/790,815

(22) Filed: Feb. 23, 2001

(65) Prior Publication Data

US 2001/0030346 A1 Oct. 18, 2001

(30) Foreign Application Priority Data

Apr. 12, 2000 (KR) ............................................ 00-19241

(51) Int. Cl.$^7$ .............................................. H01L 29/76
(52) U.S. Cl. ........................ 257/339; 257/341; 257/343; 257/401
(58) Field of Search ................................. 257/335, 337, 257/339, 341–343, 401, 491–493

(56) References Cited

U.S. PATENT DOCUMENTS 5,258,636 A   11/1993   Rumennik et al.

FOREIGN PATENT DOCUMENTS

JP   8213604   8/1996
KR   P2000-0002262   6/1998

*Primary Examiner*—Tom Thomas
*Assistant Examiner*—Ori Nadav
(74) *Attorney, Agent, or Firm*—Rothwell, Figg, Ernst & Manbeck

(57) ABSTRACT

A power semiconductor device and a method for fabricating the same are provided. The power semiconductor device includes a source structure having a projected portion with a tip-shaped end portion on its center and formed so as to surround a predetermined region of right and left and upper portions of the projected portion. Two drain structures are formed in a predetermined region surrounded by the source structure. Extended drain structures are formed around the drain structures and the extended drain structures function as a channel with a field effect channel between sides of the projected portion of the source structure. Accordingly, since there are no drain structures on the tip of the projected portion of the source structure, although a radius of curvature of the tip of the projected portion is small, a decrease in a breakdown voltage of a device due to the small radius of curvature of the tip of the projected portion can be suppressed. As a result, a power semiconductor device having a small radius of curvature of the source structure and a high breakdown voltage can be provided.

4 Claims, 7 Drawing Sheets

POWER SEMICONDUCTOR DEVICE HAVING HIGH BREAKDOWN VOLTAGE AND METHOD FOR FABRICATING THE SAME

BACKGROUND OF THE INVENTION

1. Field of the Invention

The present invention relates to a power semiconductor device and a method for fabricating the same, and more particularly, to a power semiconductor device having a source structure of a narrow radius of curvature and a high breakdown voltage and a method for fabricating the same.

2. Description of the Related Art

In a power semiconductor device, a radius of curvature of a source region or a drain region has a close relation with a breakdown voltage of a device. In particular, the radius of curvature of the source region which is relatively small, is one of main causes for decreasing the breakdown voltage of the device. As well known, this is the reason why a field crowding phenomenon occurs in a junction of a narrow radius of curvature.

FIG. 1 is a lay-out view of a conventional power semiconductor device, for example, a field effect transistor (FET). FIG. 2 is a sectional view taken along line II–II' of FIG. 1. Same reference numerals in FIGS. 1 and 2 denote the same region or layer.

As shown in FIGS. 1 and 2, a conventional FET 1 includes a source structure 10 having a line segment-shaped projected portion 10' on its center, formed so as to surround a predetermined region of right and left and upper portions of the projected portion 10'. The FET 1 includes a drain structure 20 formed so as to surround the projected portion 10' of the source structure 10 in a region surrounded by the source structure 10. The drain structure 20 is spaced-apart from the source structure 10.

The source structure 10 includes a source electrode 11 on the surface of a semiconductor substrate 2, a region of first conductivity type impurities, for example, a p-type well region 12 formed in the semiconductor substrate 2 under the source electrode 11, and a region having a high concentration of second conductivity type impurities, for example, a n$^+$-type source region 13, and a region having a high concentration of first conductivity type impurities, for example, a p$^+$-type region 14, which are formed under the surface of the p-type well region 12.

The drain structure 20 includes a drain electrode 21 on the surface of the semiconductor substrate 2 and a n-type well region 22 formed in the semiconductor substrate 2 under the drain electrode 21. The n-type well region 22, as known from a sectional structure of FIG. 2, is connected to an extended drain structure 23 of a second conductivity type which is not surrounded by the drain electrode 21. The drain structure 20 also includes a n$^+$-type drain region 24 formed under the surface of the n-type well region 22. The extended drain structure 23 includes a p-type top region 25 formed under the surface of the n-type well region 22.

A gate electrode 30 is formed so as to be insulated from a channel region by a gate dielectric layer 40. The source electrode 11, the drain electrode 21, and the gate electrode 30 are insulated one another by an interdielectric layer 50.

In the conventional FET, a channel is uniformly formed between the source structure 10 and the drain structure 20. Thus, a channel current is nearly uniformly distributed. In this case, a breakdown current is generated by the field crowding phenomenon in a tip 10t of the projected portion 10' of the source structure 10. To prevent the phenomenon, a radius of curvature of the tip 10t must be increased, however, in that case, the area of the transistor is increased.

SUMMARY OF THE INVENTION

To solve the above problems, it is an object of the present invention to provide a power semiconductor device having a source structure of a small radius of curvature and a small area of a transistor and a high breakdown voltage.

It is another object of the present invention to provide a method for fabricating the power semiconductor device.

Accordingly, to achieve the above object, there is provided a power semiconductor device. The power semiconductor device includes a source structure having a projected portion with a tip-shaped end portion on its center, formed so as to surround a predetermined region of right and left and upper portions of the projected portion, and containing a source electrode formed so as to contact extended regions of first and second conductivity types with high concentration in a well region of a first conductivity type, drain structures formed so that two drain structures are separated each other in a predetermined region surrounded by the source structure and each of the two drain structures is spaced-apart from the side of the projected portion of the source structure and does not exist on the end portion of the projected portion, and containing a drain electrode formed so as to contact an extended region of a second conductivity type with high concentration in a well region of a second conductivity type, extended drain structures formed so as to be connected to the well region of a second conductivity type and extend from the drain structures to a predetermined distance, and forming a channel with a field effect channel between sides of the projected portion of the source structure and the extended drain structures, and not forming a channel in an upper portion of the projected portion of the source structure, and a gate structure arranged on the field effect channel between the source structure and the extended drain structures.

Preferably, the extended drain structures contain the extended well region of the second conductivity type connected to the second conductivity type well region and a top region of a first conductivity type formed under the surface of the extended well region of the second conductivity type.

Preferably, the drain structures are connected to the drain electrode in an adjacent drain structure.

In order to achieve another object, there is provided a method for fabricating a power semiconductor device. The method comprises the steps of: forming so that two well regions of a second conductivity type under the surface of a semiconductor substrate of a first conductivity type are spaced-apart from each other; forming a well region of a first conductivity type so as to surround the well region of a second conductivity type, and having a projected portion with a tip-shaped end portion so as to be in line with the well regions of a second conductivity type between adjacent well regions of a second conductivity type; forming drain and source regions of a second conductivity type with high concentration, respectively, in the well regions of a second conductivity type and a first conductivity type; forming a gate dielectric layer on the surface of the semiconductor substrate between the well regions of a second conductivity type and a first conductivity type; forming a gate electrode on the gate dielectric layer; forming a drain electrode on the drain region of a second conductivity type with high concentration; and forming a source electrode on the source region of a second conductivity type with high concentration.

The method further comprises the step of forming a top region of a first conductivity type around the drain region in the well region of a second conductivity type.

The method further comprises the step of forming a first conductive region with high concentration so as to be adjacent to the source region in the well region of a first conductivity type.

Preferably, the drain electrode is formed so as to connect adjacent drain electrodes each other.

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF THE INVENTION

Figure 1:
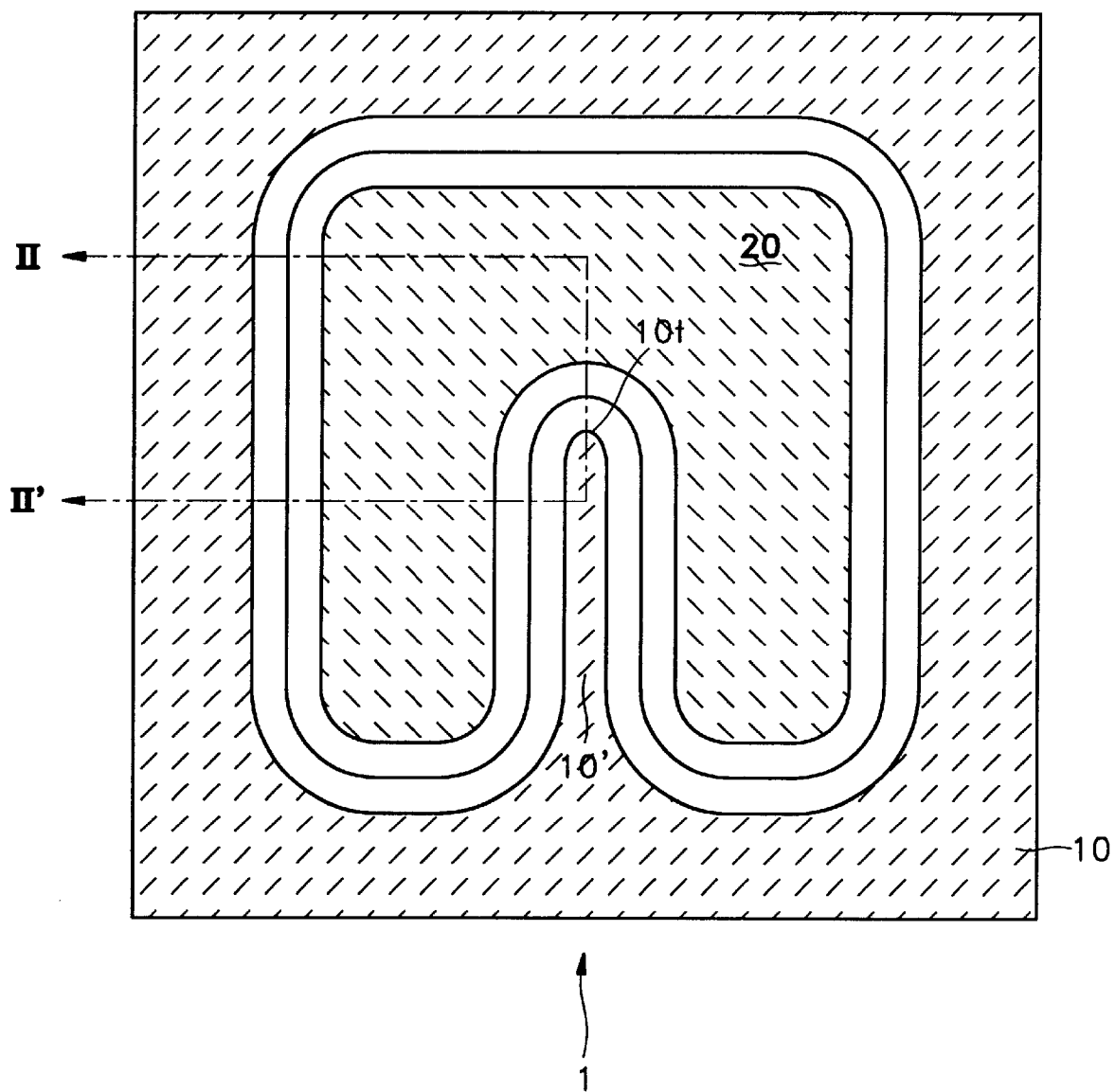
FIG. 1 is a lay-out view of a conventional power semiconductor device.
Figure 2:
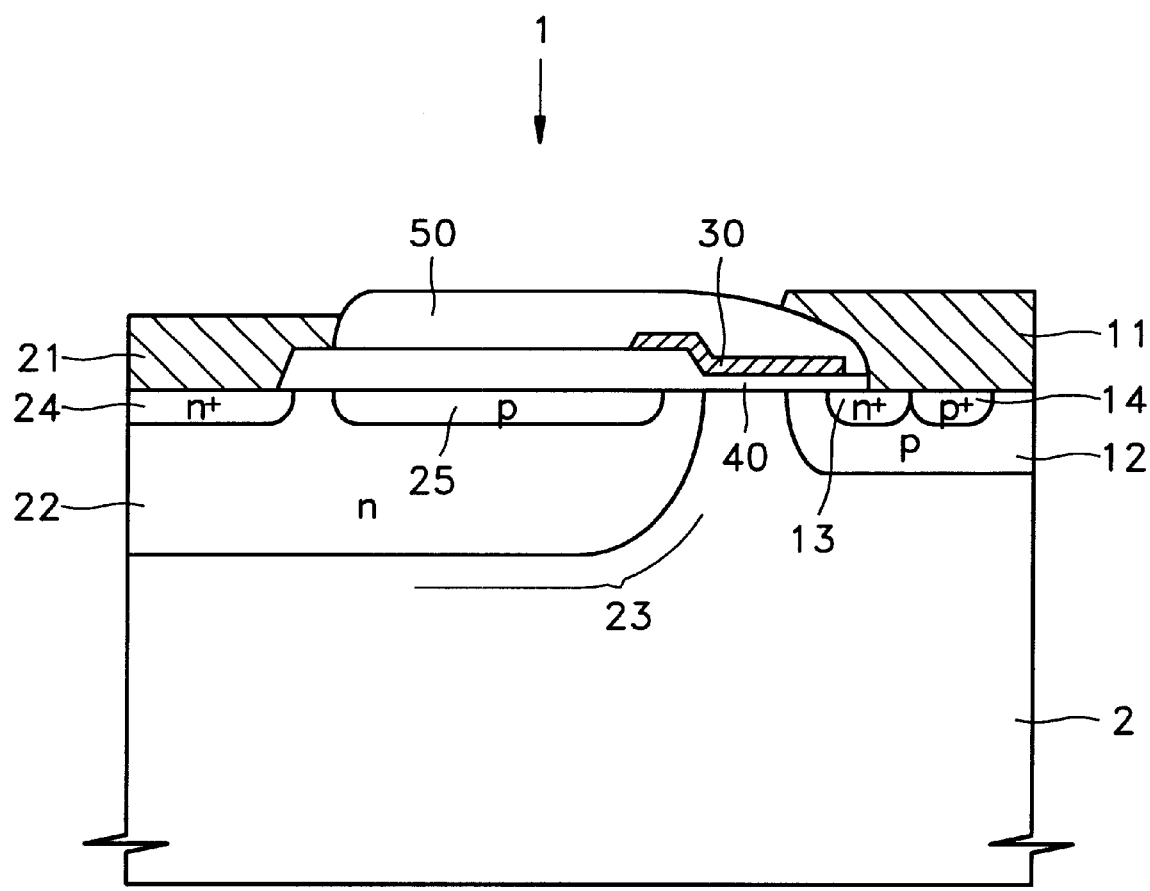
FIG. 2 is a sectional view taken along line II–II' of FIG. 1.

The same reference numerals as those of FIGS. 3 through 6 denote the same region or layer.

Figure 3:
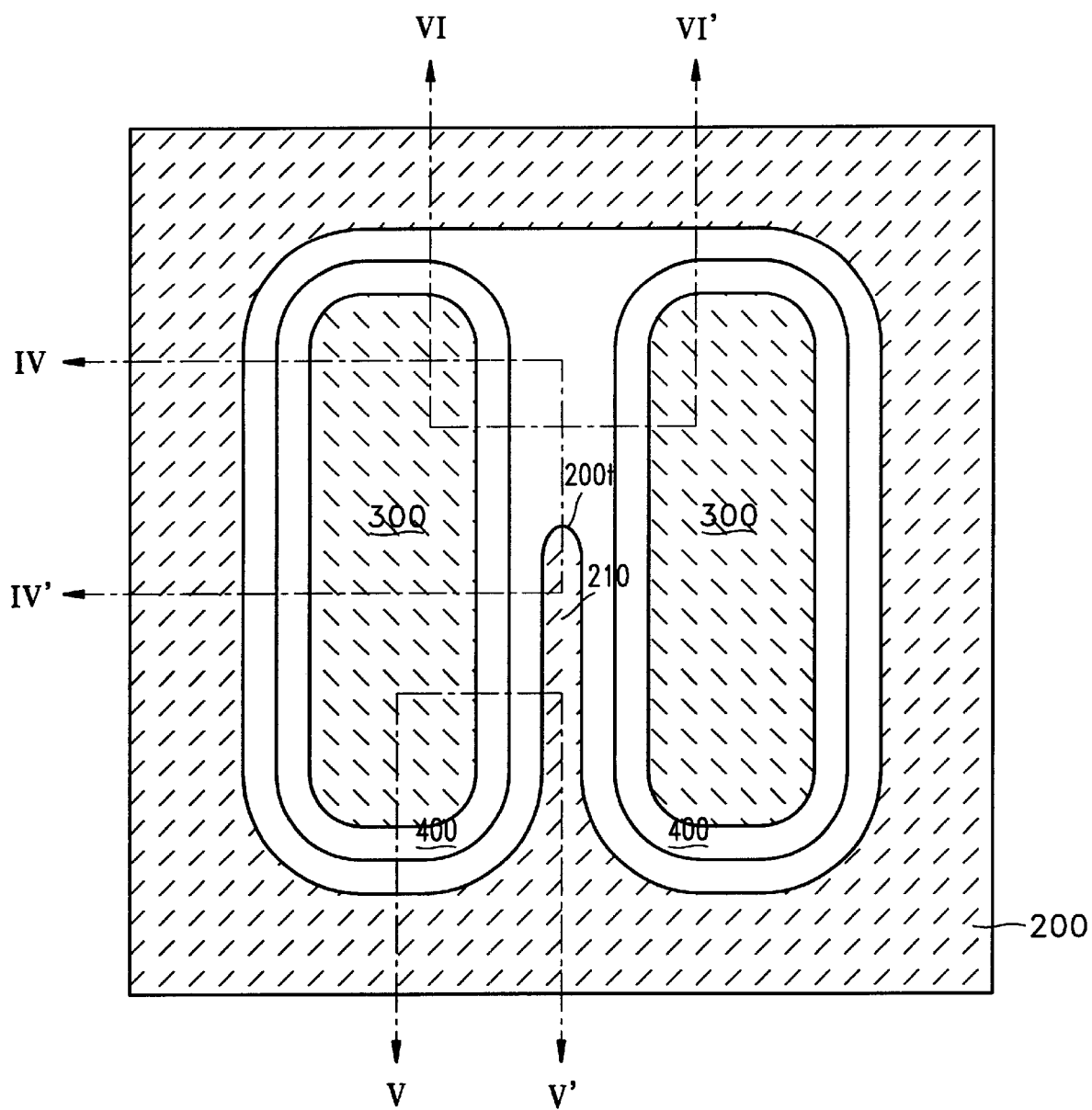
FIG. 3 is a lay-out view of a power semiconductor device according to a preferred embodiment of the present invention.
Figure 4:
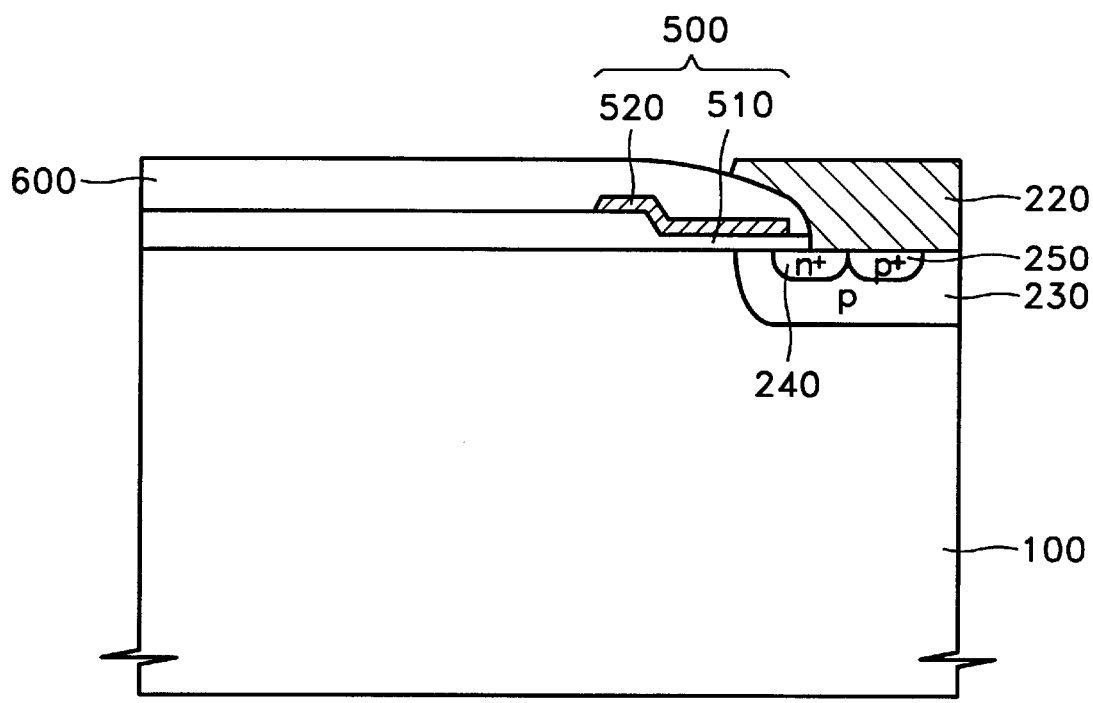
FIG. 4 is a sectional view taken along line IV–IV' of FIG. 3.
Figure 5:
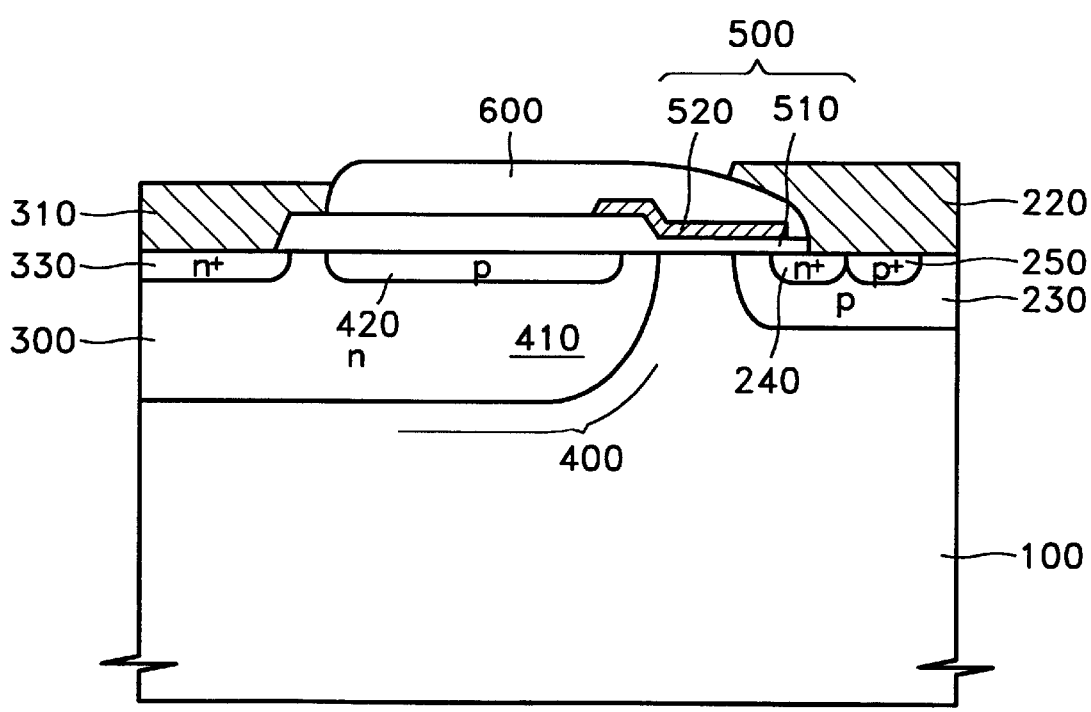
FIG. 5 is a sectional view taken along line V–V' of FIG. 3.

Referring to FIGS. 3 through 5, a power semiconductor device according to the present invention, for example, a field effect transistor (FET) is formed of a source structure 200, drain structures 300, extended drain structures 400, and a gate structure 500.

The source structure 200 has a projected portion 210 having an end portion in shape of a tip 200t on its center and is formed to surround a predetermined region of right and left and upper portions of the projected portion 210. The source structure 200 includes a source electrode 220 on the surface of a semiconductor substrate 100, a region of first conductivity type impurities, for example, a p-type well region 230 formed in the semiconductor substrate 100 under the source electrode 220, and a region having a high concentration of second conductivity type impurities, for example, a n$^+$-type source region 240, and a region having a high concentration of first conductivity type impurities, for example, a p$^+$-type region 250, which are formed under the surface of the p-type well region 230.

The drain structures 300 are formed so that two drain structures are separated each other in a predetermined region surrounded by the source structure 200. Each of the two drain structures 300 is spaced-apart from the side of the projected portion 210 of the source structure 200. The drain structures 300 include a drain electrode 310 on the surface of the semiconductor 100 and a n-type well region 320 formed in the semiconductor substrate 100 under the drain electrode 310. The drain structures 300 also include a n$^+$-type drain region 330 formed under the surface of the n-type well region 320.

The extended drain structures 400 includes an extended n-type well region 410 formed to be connected to the n-type well region 320 and extend from the drain structures 300 to a predetermined distance. The extended drain structures 400 also include a p-type top region 420 formed under the surface of the extended n-type well region 410. The extended drain structures 400 function as a channel with a field effect channel formed between sides of the projected portion 210 of the source structure 200 and the extended drain structures 400.

The gate structure 500 includes a gate dielectric layer 510 formed on the surface of the semiconductor substrate 100 between the source structure 200 and the extended drain structures 400 and a gate electrode 520 formed on the gate dielectric layer 510.

The source electrode 220, the drain electrode 310, and the gate electrode 520 are insulated one another by an insulating layer 600.

Figure 6:
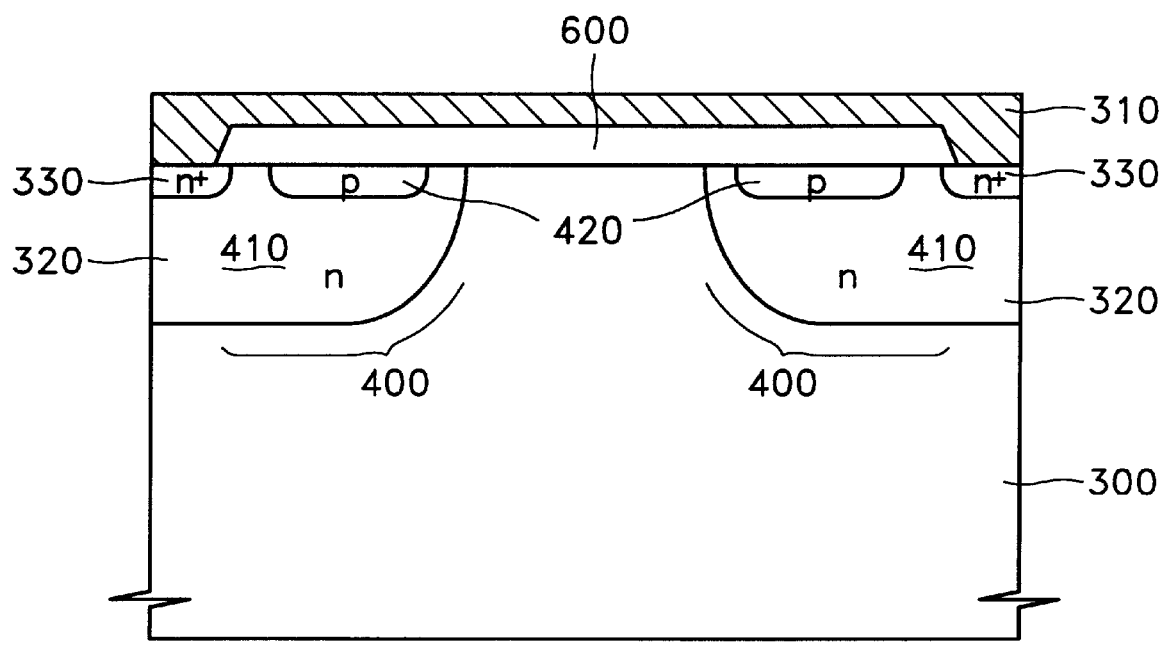
FIG. 6 is a sectional view taken along line VI–VI' of FIG. 3.

In the FET having the above structure, a channel is a little unevenly formed between the source structure 200 and the drain structures 300. As shown in FIG. 5, an uniform channel width is formed in a portion whose distance between the source structure 200 and the drain structure 300 is uniform, but, as shown in FIG. 4, a channel width in a tip 200t of the source structure 200 is not uniformly formed. Also, as shown in FIG. 6, since there are no drain structures 300 in an upper portion of the tip 200t of the source structure 200, a channel itself is almost not formed in the upper portion of the tip 200t of the source structure 200. Thus, although a radius of curvature of the tip 200t of the projected portion 210 of the source structure 200 is small, a field crowding phenomenon in the portion weakens, and thus, a breakdown voltage of a device is increased.

Figure 7:
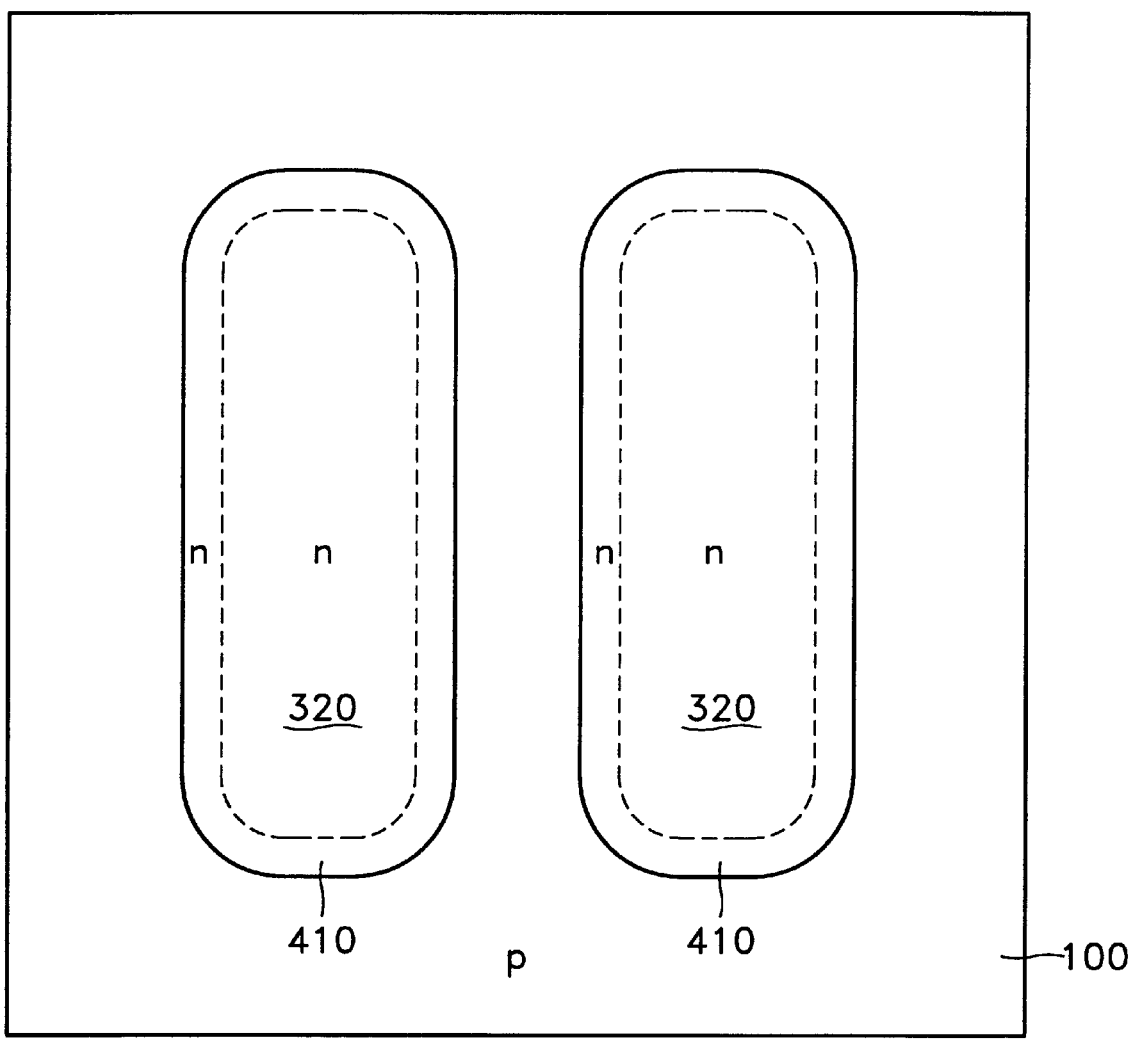
FIGS. 7 and 8 are lay-out views illustrating a method for fabricating the power semiconductor device according to the present invention.

First, referring to FIG. 7, n-type well regions 320 and extended n-type well regions 410 are formed under the surface of a p-type semiconductor substrate 100. The n-type well regions 320 are formed so that two n-type well regions are spaced-apart from each other at a predetermined distance. The extended n-type well regions 410 are formed to extend from the edge of the n-type well region 320 to a predetermined distance and to surround the n-type well regions 320 fully. Since the extended n-type well regions 410 are connected one another to the n-type well regions 320, two regions can be simultaneously formed by an ion implantation process using one mask layer pattern for exposing the two regions.

More specifically, a thermal oxide film (not shown) 100–2000 Å thick is formed on the p-type semiconductor substrate 100. The mask layer pattern is formed thereon using a photoresist layer. As described previously, the mask layer pattern has two openings for exposing portions to form a pair of n-type well regions 320 and a pair of extended n-type well regions 410. Each of the openings is arranged to be spaced-apart from one another at a predetermined distance. Next, n-type impurity ions are implanted by using the mask layer pattern as an ion implantation mask. After removing the mask layer pattern, a thermal diffusion process is performed, and thus, the n-type well regions 320 and the extended n-type well regions 410 are formed.

Figure 8:
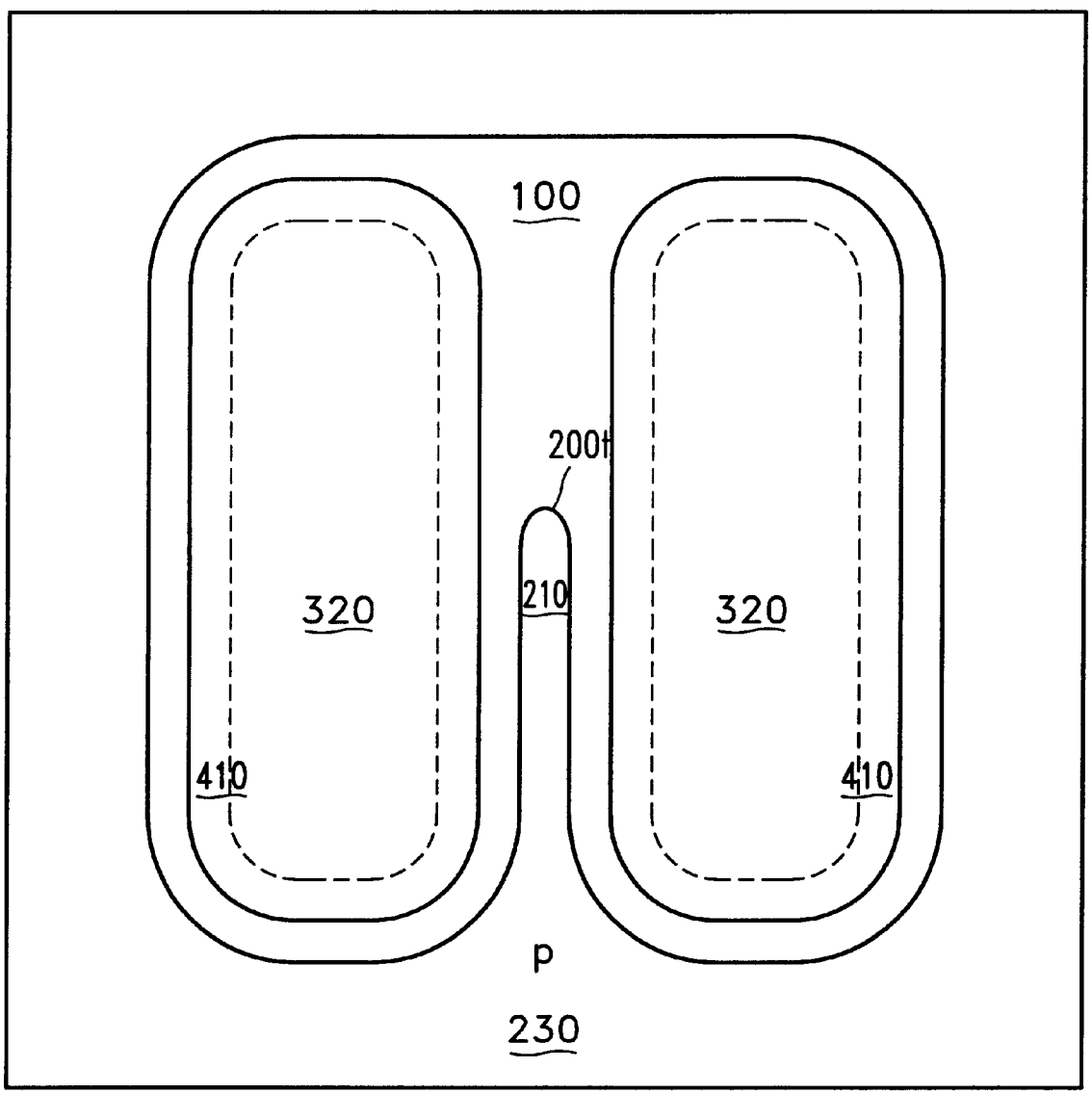

Next, as shown in FIG. 8, the ion implantation process and the diffusion process using a given mask layer pattern are performed, and thus, a p-type well region 230 is formed to surround the n-type well regions 320 and the extended n-type well regions 410 fully. Here, the p-type well region 230 is spaced-apart from the extended n-type well regions 410 so that a part of a p-type semiconductor substrate 100 is exposed. Also, the p-type well region 230 is formed to have a projected portion 210 with a tip 200t-shaped end portion between the adjacent two extended n-type well regions 410. When forming the p-type well region 230, the p-type top region 420 shown in FIGS. 5 and 6 can be also formed under the surface of the extended n-type well regions 410.

Next, as shown in FIGS. 4 through 6, a gate dielectric layer 510, a gate electrode 520, a n$^+$-type source region 330, a n$^+$-type drain region 240, a p$^+$-type region 250, a drain electrode 310, and a source electrode 220 are formed using the process of fabricating a conventional MOSFET.

That is, the gate dielectric layer 510 is formed after forming a field oxide film in which a conventional local oxidation of silicon (LOCOS) is implemented. The gate electrode 520 is formed on the gate dielectric layer 510. The gate electrode 520 can be formed using a polysilicon layer. After that, the n$^+$-type source region 330 in the n-type well regions 320 and the n$^+$-type drain region 240 in the p-type well region 230 are formed using the ion implantation process and the diffusion process using a given mask layer pattern, respectively. Next, the p$^+$-type region 250 in the p-type well region 230 is formed using the ion implantation process and the diffusion process using another mask layer pattern. Subsequently, when the source electrode 220 and the drain electrode 310 are formed, as shown in FIGS. 3 through 6, a power semiconductor device according to the present invention is fabricated.

As described above, since there are no drain structures on the tip of the source structure having the projected portion with the tip-shaped end portion, although a radius of curvature of the tip of the projected portion is narrow, a decrease in a breakdown voltage of a device does not occur. As a result, a power semiconductor device having a narrow radius of curvature of the tip without a decrease in a breakdown voltage can be provided.

What is claimed is:

1. A power semiconductor device comprising:
    a source structure having a projected portion with a tip-shaped end portion on its center, formed so as to surround a predetermined region of right and left and upper portions of the projected portion, and containing a source electrode formed so as to contact extended regions of first and second conductivity types with high concentration in a well region of a first conductivity type;
    drain structures formed so that two drain structures are separated each other in a predetermined region surrounded by the source structure and each of the two drain structures is spaced-apart from the side of the projected portion of the source structure and does not exist on the end portion of the projected portion, and containing a drain electrode formed so as to contact an extended region of a second conductivity type with high concentration in a well region of a second conductivity type;
    extended drain structures formed so as to be connected to the well region of a second conductivity type and extend from the drain structures to a predetermined distance, and forming a channel with a field effect channel between sides of the projected portion of the source structure and the extended drain structures, and not forming a channel in an upper portion of the projected portion of the source structure; and
    a gate structure arranged on the field effect channel between the source structure and the extended drain structures.

2. The power semiconductor device according to claim 1, wherein the extended drain structures contain the extended well region of the second conductivity type connected to the second conductivity type well region and a top region of a first conductivity type formed under the surface of the extended well region of the second conductivity type.

3. The power semiconductor device according to claim 1, wherein the drain structures are connected to the drain electrode in an adjacent drain structure.

4. The power semiconductor device according to claim 1, wherein the first conductivity type is p-type impurities, and the second conductivity type is n-type impurities.

* * * * *